(12) United States Patent
Lenk

(10) Patent No.: US 8,981,405 B2
(45) Date of Patent: *Mar. 17, 2015

(54) DIFFUSER FOR LED LIGHT SOURCES

(71) Applicant: Switch Bulb Company, Inc., San Jose, CA (US)

(72) Inventor: Carol Lenk, Woodstock, GA (US)

(73) Assignee: Switch Bulb Company, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/854,730

(22) Filed: Apr. 1, 2013

(65) Prior Publication Data
US 2013/0214313 A1 Aug. 22, 2013

Related U.S. Application Data

(63) Continuation of application No. 12/739,944, filed as application No. PCT/US2008/011984 on Oct. 21, 2008, now Pat. No. 8,415,695.

(60) Provisional application No. 60/982,314, filed on Oct. 24, 2007.

(51) Int. Cl.
H01L 33/50 (2010.01)
H01L 33/58 (2010.01)
F21V 3/00 (2006.01)
F21V 5/00 (2006.01)
F21V 29/00 (2006.01)
G02B 5/02 (2006.01)
(Continued)

(52) U.S. Cl.
CPC . *H01L 33/58* (2013.01); *F21V 3/00* (2013.01); *F21V 5/00* (2013.01); *F21V 29/004* (2013.01); *F21V 29/225* (2013.01); *G02B 5/0242* (2013.01); *G02B 5/0278* (2013.01); *F21V 17/04* (2013.01); *F21V 17/06* (2013.01); *F21Y 2101/02* (2013.01)
USPC .......................................................... 257/98

(58) Field of Classification Search
USPC .......................................................... 257/98
See application file for complete search history.

(56) References Cited

U.S. PATENT DOCUMENTS 3,962,675 A 6/1976 Rowley et al.
4,025,290 A 5/1977 Giangiulio
(Continued)

FOREIGN PATENT DOCUMENTS

CN 1834197 A 9/2006
EP 0658933 B1 10/2001
(Continued)

OTHER PUBLICATIONS

Office Action received for European Patent Application No. 08842545.9, mailed on Dec. 12, 2013, 5 pages.
(Continued)

*Primary Examiner* — Eugene Lee
(74) *Attorney, Agent, or Firm* — Morrison & Foerster LLP

(57) ABSTRACT

An LED light source is described. The light source includes an LED and a diffuser. The LED emits a light having a dominant wavelength. The diffuser includes a filler material, which includes particles. The mean diameter of the particles is at least as large as the dominant wavelength of the light emitted by the LED. The particles are configured to scatter the light emitted by the LED.

16 Claims, 4 Drawing Sheets

(51) Int. Cl.
*F21V 17/04* (2006.01)
*F21V 17/06* (2006.01)
*F21Y 101/02* (2006.01)

(56) References Cited

U.S. PATENT DOCUMENTS

| | | | |
|---|---|---|---|
| 4,039,885 A | 8/1977 | Van Boekhold et al. |
| 4,077,076 A | 3/1978 | Masters |
| 4,160,929 A | 7/1979 | Thorington et al. |
| 4,211,955 A | 7/1980 | Ray |
| 4,271,458 A | 6/1981 | George, Jr. |
| 4,289,991 A | 9/1981 | Schreurs |
| 4,290,095 A | 9/1981 | Schmidt |
| 4,325,107 A | 4/1982 | MacLeod |
| 4,336,855 A | 6/1982 | Chen |
| 4,346,324 A | 8/1982 | Yoldas |
| 4,346,329 A | 8/1982 | Schmidt |
| 4,405,744 A | 9/1983 | Greinecker et al. |
| 4,511,952 A | 4/1985 | Vanbragt |
| 4,539,516 A | 9/1985 | Thompson |
| 4,584,428 A | 4/1986 | Garlick |
| 4,611,512 A | 9/1986 | Honda |
| 4,647,331 A | 3/1987 | Koury, Jr. et al. |
| 4,650,509 A | 3/1987 | Vanbragt |
| 4,656,564 A | 4/1987 | Felder |
| 4,658,532 A | 4/1987 | McFarland et al. |
| 4,663,558 A | 5/1987 | Endo |
| 4,727,289 A | 2/1988 | Uchida |
| 4,728,999 A | 3/1988 | Dannatt et al. |
| 4,840,383 A | 6/1989 | Lombardo |
| 4,843,266 A | 6/1989 | Szanto et al. |
| 4,875,852 A | 10/1989 | Ferren |
| 4,876,632 A | 10/1989 | Osterhout et al. |
| 4,904,991 A | 2/1990 | Jones |
| 4,916,352 A | 4/1990 | Haim et al. |
| 4,942,685 A | 7/1990 | Lin |
| 4,947,300 A | 8/1990 | Wen |
| 4,967,330 A | 10/1990 | Bell et al. |
| 4,994,705 A | 2/1991 | Linder et al. |
| 5,008,588 A | 4/1991 | Nakahara |
| 5,065,226 A | 11/1991 | Kluitmans et al. |
| 5,065,291 A | 11/1991 | Frost et al. |
| 5,075,372 A | 12/1991 | Hille et al. |
| 5,119,831 A | 6/1992 | Robin et al. |
| 5,136,213 A | 8/1992 | Sacchetti |
| 5,140,220 A | 8/1992 | Hasegawa |
| 5,224,773 A | 7/1993 | Arimura |
| 5,237,490 A | 8/1993 | Ferng |
| 5,303,124 A | 4/1994 | Wrobel |
| 5,358,880 A | 10/1994 | Lebby et al. |
| 5,363,009 A | 11/1994 | Monto |
| 5,377,000 A | 12/1994 | Berends |
| 5,405,208 A | 4/1995 | Hsieh |
| 5,433,738 A | 7/1995 | Stinson |
| 5,463,280 A | 10/1995 | Johnson |
| 5,496,184 A | 3/1996 | Garrett et al. |
| 5,514,627 A | 5/1996 | Lowery et al. |
| 5,528,474 A | 6/1996 | Roney et al. |
| 5,561,347 A | 10/1996 | Nakamura et al. |
| 5,585,783 A | 12/1996 | Hall |
| 5,622,423 A | 4/1997 | Lee |
| 5,630,660 A | 5/1997 | Chen |
| 5,662,490 A | 9/1997 | Ogawa |
| 5,664,866 A | 9/1997 | Reniger et al. |
| 5,667,295 A | 9/1997 | Tsui |
| 5,684,354 A | 11/1997 | Gleckman |
| 5,685,637 A | 11/1997 | Chapman et al. |
| 5,688,042 A | 11/1997 | Madadi et al. |
| 5,726,535 A | 3/1998 | Yan |
| 5,803,588 A | 9/1998 | Costa |
| 5,807,157 A | 9/1998 | Penjuke |
| 5,813,753 A | 9/1998 | Vriens et al. |
| 5,887,967 A | 3/1999 | Chang |
| 5,890,794 A | 4/1999 | Abtahi et al. |
| 5,892,325 A | 4/1999 | Gleckman |
| 5,899,557 A | 5/1999 | McDermott |
| 5,905,343 A | 5/1999 | McCamant |
| 5,929,568 A | 7/1999 | Eggers |
| 5,931,562 A | 8/1999 | Arato |
| 5,931,570 A | 8/1999 | Yamuro |
| 5,936,599 A | 8/1999 | Reymond |
| 5,941,626 A | 8/1999 | Yamuro |
| 5,947,588 A | 9/1999 | Huang |
| 5,952,916 A | 9/1999 | Yamabe |
| 5,963,126 A | 10/1999 | Karlin et al. |
| 5,982,059 A | 11/1999 | Anderson |
| 5,984,494 A | 11/1999 | Chapman et al. |
| 6,003,033 A | 12/1999 | Amano et al. |
| 6,043,591 A | 3/2000 | Gleckman |
| 6,066,861 A | 5/2000 | Hohn et al. |
| 6,087,764 A | 7/2000 | Matei |
| 6,095,671 A | 8/2000 | Hutain |
| 6,102,809 A | 8/2000 | Nichols |
| 6,120,312 A | 9/2000 | Shu |
| 6,123,631 A | 9/2000 | Ginder |
| 6,147,367 A | 11/2000 | Yang et al. |
| 6,158,451 A | 12/2000 | Wu |
| 6,183,310 B1 | 2/2001 | Shu |
| 6,184,628 B1 | 2/2001 | Ruthenberg |
| 6,227,679 B1 | 5/2001 | Zhang et al. |
| 6,254,939 B1 | 7/2001 | Cowan et al. |
| 6,258,699 B1 | 7/2001 | Chang et al. |
| 6,268,801 B1 | 7/2001 | Wu |
| 6,273,580 B1 | 8/2001 | Coleman et al. |
| 6,276,822 B1 | 8/2001 | Bedrosian et al. |
| 6,277,685 B1 | 8/2001 | Lin et al. |
| 6,313,892 B2 | 11/2001 | Gleckman |
| 6,316,911 B1 | 11/2001 | Moskowitz et al. |
| 6,332,692 B1 | 12/2001 | McCurdy |
| 6,338,647 B1 | 1/2002 | Fernandez et al. |
| 6,357,902 B1 | 3/2002 | Horowitz |
| 6,382,582 B1 | 5/2002 | Brown |
| 6,426,704 B1 | 7/2002 | Hutchison |
| 6,471,562 B1 | 10/2002 | Liu |
| 6,478,449 B2 | 11/2002 | Lee et al. |
| 6,480,389 B1 | 11/2002 | Shie et al. |
| 6,488,392 B1 | 12/2002 | Lu |
| 6,496,237 B1 | 12/2002 | Gleckman |
| 6,513,955 B1 | 2/2003 | Waltz |
| 6,528,954 B1 | 3/2003 | Lys et al. |
| 6,534,988 B2 | 3/2003 | Flory, IV |
| 6,541,800 B2 | 4/2003 | Barnett et al. |
| 6,547,417 B2 | 4/2003 | Lee |
| 6,568,834 B1 | 5/2003 | Scianna |
| 6,582,100 B1 | 6/2003 | Hochstein et al. |
| 6,608,272 B2 | 8/2003 | Garcia |
| 6,612,712 B2 | 9/2003 | Nepil |
| 6,619,829 B1 | 9/2003 | Chen |
| 6,626,557 B1 | 9/2003 | Taylor |
| 6,639,360 B2 | 10/2003 | Roberts et al. |
| 6,655,810 B2 | 12/2003 | Hayashi et al. |
| 6,659,632 B2 | 12/2003 | Chen |
| 6,685,852 B2 | 2/2004 | Setlur et al. |
| 6,709,132 B2 | 3/2004 | Ishibashi |
| 6,711,426 B2 | 3/2004 | Benaron et al. |
| 6,713,961 B2 | 3/2004 | Honda et al. |
| 6,734,633 B2 | 5/2004 | Matsuba et al. |
| 6,741,029 B2 | 5/2004 | Matsubara et al. |
| 6,742,907 B2 | 6/2004 | Funamoto et al. |
| 6,746,885 B2 | 6/2004 | Cao |
| 6,750,824 B1 | 6/2004 | Shen |
| 6,773,192 B1 | 8/2004 | Chao |
| 6,789,348 B1 | 9/2004 | Kneller et al. |
| 6,791,259 B1 | 9/2004 | Stokes et al. |
| 6,791,283 B2 | 9/2004 | Bowman et al. |
| 6,793,362 B2 | 9/2004 | Tai |
| 6,793,363 B2 | 9/2004 | Jensen |
| 6,796,698 B2 | 9/2004 | Sommers et al. |
| 6,805,461 B2 | 10/2004 | Witte |
| 6,819,049 B1 | 11/2004 | Bohmer et al. |
| 6,819,056 B2 | 11/2004 | Lin |
| 6,828,590 B2 | 12/2004 | Hsiung |
| 6,842,204 B1 | 1/2005 | Johnson |
| 6,864,513 B2 | 3/2005 | Lin et al. |

(56) References Cited

U.S. PATENT DOCUMENTS

| | | |
|---|---|---|
| 6,864,554 B2 | 3/2005 | Lin et al. |
| 6,881,980 B1 | 4/2005 | Ting |
| 6,886,963 B2 | 5/2005 | Lodhie |
| 6,903,380 B2 | 6/2005 | Barnett et al. |
| 6,905,231 B2 | 6/2005 | Dickie |
| 6,910,794 B2 | 6/2005 | Rice |
| 6,911,678 B2 | 6/2005 | Fujisawa et al. |
| 6,911,915 B2 | 6/2005 | Wu et al. |
| 6,926,973 B2 | 8/2005 | Suzuki et al. |
| 6,927,683 B2 | 8/2005 | Sugimoto et al. |
| 6,932,638 B1 | 8/2005 | Burrows et al. |
| 6,936,857 B2 | 8/2005 | Doxsee et al. |
| 6,943,357 B2 | 9/2005 | Srivastava et al. |
| 6,948,829 B2 | 9/2005 | Verdes et al. |
| 6,956,243 B1 | 10/2005 | Chin |
| 6,963,688 B2 | 11/2005 | Nath |
| 6,964,878 B2 | 11/2005 | Horng et al. |
| 6,967,445 B1 | 11/2005 | Jewell et al. |
| 6,971,760 B2 | 12/2005 | Archer et al. |
| 6,974,924 B2 | 12/2005 | Agnatovech et al. |
| 6,982,518 B2 | 1/2006 | Chou et al. |
| 6,983,506 B1 | 1/2006 | Brown |
| 7,022,260 B2 | 4/2006 | Morioka |
| 7,042,150 B2 | 5/2006 | Yasuda |
| 7,058,103 B2 | 6/2006 | Ishida et al. |
| D525,374 S | 7/2006 | Maxik et al. |
| 7,073,920 B2 | 7/2006 | Konkle, Jr. et al. |
| 7,074,631 B2 | 7/2006 | Erchak et al. |
| 7,075,112 B2 | 7/2006 | Roberts et al. |
| 7,078,732 B1 | 7/2006 | Reeh et al. |
| D527,119 S | 8/2006 | Maxik et al. |
| 7,086,756 B2 | 8/2006 | Maxik |
| 7,086,767 B2 | 8/2006 | Sidwell et al. |
| D528,673 S | 9/2006 | Maxik et al. |
| D531,740 S | 11/2006 | Maxik |
| D532,532 S | 11/2006 | Maxik |
| 7,138,666 B2 | 11/2006 | Erchak et al. |
| 7,161,311 B2 | 1/2007 | Mueller et al. |
| 7,186,016 B2 | 3/2007 | Jao |
| 7,213,934 B2 | 5/2007 | Zarian et al. |
| 7,239,080 B2 | 7/2007 | Ng et al. |
| 7,241,039 B2 | 7/2007 | Hulse |
| 7,246,919 B2 | 7/2007 | Porchia et al. |
| 7,261,454 B2 | 8/2007 | Ng |
| 7,264,527 B2 | 9/2007 | Bawendi et al. |
| 7,270,446 B2 | 9/2007 | Chang et al. |
| 7,288,798 B2 | 10/2007 | Chang et al. |
| 7,315,119 B2 | 1/2008 | Ng et al. |
| 7,344,279 B2 | 3/2008 | Mueller et al. |
| 7,350,933 B2 | 4/2008 | Ng et al. |
| 7,367,692 B2 | 5/2008 | Maxik |
| 7,396,142 B2 | 7/2008 | Laizure, Jr. et al. |
| 7,489,031 B2 | 2/2009 | Roberts et al. |
| 7,513,669 B2 | 4/2009 | Chua et al. |
| 7,677,765 B2 | 3/2010 | Tajul et al. |
| 7,884,544 B2 | 2/2011 | Takezawa et al. |
| 8,154,190 B2 | 4/2012 | Ishii et al. |
| 8,552,448 B2 * | 10/2013 | Ichikawa .................. 257/98 |
| 2001/0008436 A1 | 7/2001 | Gleckman |
| 2001/0009400 A1 | 7/2001 | Maeno et al. |
| 2001/0019134 A1 | 9/2001 | Chang et al. |
| 2001/0026447 A1 | 10/2001 | Herrera |
| 2001/0035264 A1 | 11/2001 | Padmanabhan |
| 2001/0053077 A1 | 12/2001 | Anwly-Davies et al. |
| 2002/0021573 A1 | 2/2002 | Zhang |
| 2002/0039872 A1 | 4/2002 | Asai et al. |
| 2002/0068775 A1 | 6/2002 | Munzenberger |
| 2002/0070449 A1 | 6/2002 | Yagi et al. |
| 2002/0085379 A1 | 7/2002 | Han et al. |
| 2002/0093287 A1 | 7/2002 | Chen |
| 2002/0097586 A1 | 7/2002 | Horowitz |
| 2002/0117692 A1 | 8/2002 | Lin |
| 2002/0126491 A1 | 9/2002 | Chen |
| 2002/0145863 A1 | 10/2002 | Stultz |
| 2002/0149312 A1 | 10/2002 | Roberts et al. |
| 2002/0153829 A1 | 10/2002 | Asai et al. |
| 2002/0154449 A1 | 10/2002 | Raphael et al. |
| 2002/0176246 A1 | 11/2002 | Chen |
| 2002/0183438 A1 | 12/2002 | Amarasekera et al. |
| 2002/0186538 A1 | 12/2002 | Kase et al. |
| 2003/0025449 A1 | 2/2003 | Rossner |
| 2003/0038596 A1 | 2/2003 | Ho |
| 2003/0043579 A1 | 3/2003 | Rong et al. |
| 2003/0048632 A1 | 3/2003 | Archer |
| 2003/0058658 A1 | 3/2003 | Lee |
| 2003/0067265 A1 | 4/2003 | Srivastava et al. |
| 2003/0072156 A1 | 4/2003 | Pohlert et al. |
| 2003/0079387 A1 | 5/2003 | Derose |
| 2003/0111955 A1 | 6/2003 | McNulty et al. |
| 2003/0128629 A1 | 7/2003 | Stevens |
| 2003/0142508 A1 | 7/2003 | Lee |
| 2003/0164666 A1 | 9/2003 | Crunk |
| 2003/0185020 A1 | 10/2003 | Stekelenburg |
| 2003/0193841 A1 | 10/2003 | Crunk |
| 2003/0201903 A1 | 10/2003 | Shen |
| 2003/0214233 A1 | 11/2003 | Takahashi et al. |
| 2003/0230045 A1 | 12/2003 | Krause, Sr. et al. |
| 2003/0231510 A1 | 12/2003 | Tawa et al. |
| 2004/0001338 A1 | 1/2004 | Pine |
| 2004/0004435 A1 | 1/2004 | Hsu |
| 2004/0004441 A1 | 1/2004 | Yano |
| 2004/0007980 A1 | 1/2004 | Shibata |
| 2004/0008525 A1 | 1/2004 | Shibata |
| 2004/0014414 A1 | 1/2004 | Horie et al. |
| 2004/0039274 A1 | 2/2004 | Benaron et al. |
| 2004/0039764 A1 | 2/2004 | Gonikberg et al. |
| 2004/0056600 A1 | 3/2004 | Lapatovich et al. |
| 2004/0085017 A1 | 5/2004 | Lee |
| 2004/0085758 A1 | 5/2004 | Deng |
| 2004/0101802 A1 | 5/2004 | Scott |
| 2004/0105262 A1 | 6/2004 | Tseng et al. |
| 2004/0113549 A1 | 6/2004 | Roberts et al. |
| 2004/0114352 A1 | 6/2004 | Jensen |
| 2004/0114367 A1 | 6/2004 | Li |
| 2004/0125034 A1 | 7/2004 | Shen |
| 2004/0125515 A1 | 7/2004 | Popovich |
| 2004/0127138 A1 | 7/2004 | Huang |
| 2004/0179355 A1 | 9/2004 | Gabor |
| 2004/0183458 A1 | 9/2004 | Lee |
| 2004/0187313 A1 | 9/2004 | Zirk et al. |
| 2004/0189262 A1 | 9/2004 | McGrath |
| 2004/0190305 A1 | 9/2004 | Arik et al. |
| 2004/0201673 A1 | 10/2004 | Asai |
| 2004/0207334 A1 | 10/2004 | Lin |
| 2004/0208002 A1 | 10/2004 | Wu |
| 2004/0211589 A1 | 10/2004 | Chou et al. |
| 2004/0217693 A1 | 11/2004 | Duggal et al. |
| 2004/0233661 A1 | 11/2004 | Taylor |
| 2004/0245912 A1 | 12/2004 | Thurk et al. |
| 2004/0257804 A1 | 12/2004 | Lee |
| 2004/0264192 A1 | 12/2004 | Nagata et al. |
| 2005/0007010 A1 | 1/2005 | Lee |
| 2005/0007770 A1 | 1/2005 | Bowman et al. |
| 2005/0011481 A1 | 1/2005 | Naumann et al. |
| 2005/0015029 A1 | 1/2005 | Kim |
| 2005/0018424 A1 | 1/2005 | Popovich |
| 2005/0023540 A1 | 2/2005 | Yoko et al. |
| 2005/0030761 A1 | 2/2005 | Burgess |
| 2005/0031281 A1 | 2/2005 | Nath |
| 2005/0036299 A1 | 2/2005 | Tsai |
| 2005/0036616 A1 | 2/2005 | Huang et al. |
| 2005/0047170 A1 | 3/2005 | Hillburger et al. |
| 2005/0052885 A1 | 3/2005 | Wu |
| 2005/0057187 A1 | 3/2005 | Catalano |
| 2005/0063185 A1 | 3/2005 | Monjo et al. |
| 2005/0067343 A1 | 3/2005 | Zulauf et al. |
| 2005/0068776 A1 | 3/2005 | Ge |
| 2005/0084229 A1 | 4/2005 | Babbitt et al. |
| 2005/0099787 A1 | 5/2005 | Hayes |
| 2005/0105302 A1 | 5/2005 | Hofmann et al. |
| 2005/0110191 A1 | 5/2005 | Lin |
| 2005/0110384 A1 | 5/2005 | Peterson |
| 2005/0111234 A1 | 5/2005 | Martin et al. |
| 2005/0117320 A1 | 6/2005 | Leu et al. |

(56) References Cited

U.S. PATENT DOCUMENTS

| | | |
|---|---|---|
| 2005/0127385 A1 | 6/2005 | Reeh et al. |
| 2005/0141221 A1 | 6/2005 | Yu |
| 2005/0151664 A1 | 7/2005 | Kolish et al. |
| 2005/0152136 A1 | 7/2005 | Konkle, Jr. et al. |
| 2005/0162864 A1 | 7/2005 | Verdes et al. |
| 2005/0174065 A1 | 8/2005 | Janning |
| 2005/0174769 A1 | 8/2005 | Yong et al. |
| 2005/0174780 A1 | 8/2005 | Park |
| 2005/0179358 A1 | 8/2005 | Soules et al. |
| 2005/0179379 A1 | 8/2005 | Kim |
| 2005/0180136 A9 | 8/2005 | Popovich |
| 2005/0180137 A1 | 8/2005 | Hsu |
| 2005/0207152 A1 | 9/2005 | Maxik |
| 2005/0207159 A1 | 9/2005 | Maxik |
| 2005/0217996 A1 | 10/2005 | Liu et al. |
| 2005/0224829 A1 | 10/2005 | Negley et al. |
| 2005/0230691 A1 | 10/2005 | Amiotti et al. |
| 2005/0233485 A1 | 10/2005 | Shishov et al. |
| 2005/0237995 A1 | 10/2005 | Puranik |
| 2005/0243539 A1 | 11/2005 | Evans et al. |
| 2005/0243550 A1 | 11/2005 | Stekelenburg |
| 2005/0255026 A1 | 11/2005 | Barker et al. |
| 2005/0258446 A1 | 11/2005 | Raos et al. |
| 2005/0259419 A1 | 11/2005 | Sandoval |
| 2005/0265039 A1 | 12/2005 | Lodhie et al. |
| 2005/0270780 A1 | 12/2005 | Zhang |
| 2005/0276034 A1 | 12/2005 | Malpetti |
| 2005/0276051 A1 | 12/2005 | Caudle et al. |
| 2005/0276053 A1 | 12/2005 | Nortrup et al. |
| 2005/0276072 A1 | 12/2005 | Hayashi et al. |
| 2005/0285494 A1 | 12/2005 | Cho et al. |
| 2006/0002110 A1 | 1/2006 | Dowling et al. |
| 2006/0007410 A1 | 1/2006 | Masuoka et al. |
| 2006/0012770 A1 | 1/2006 | Dierichs |
| 2006/0022214 A1 | 2/2006 | Morgan et al. |
| 2006/0034077 A1 | 2/2006 | Chang |
| 2006/0044803 A1 | 3/2006 | Edwards |
| 2006/0050514 A1 | 3/2006 | Opolka |
| 2006/0061985 A1 | 3/2006 | Elkins |
| 2006/0071591 A1 | 4/2006 | Takezawa et al. |
| 2006/0092644 A1 | 5/2006 | Mok et al. |
| 2006/0142946 A1 | 6/2006 | Goujon et al. |
| 2006/0145172 A1 | 7/2006 | Su et al. |
| 2006/0176699 A1 | 8/2006 | Crunk |
| 2006/0187653 A1 | 8/2006 | Olsson |
| 2006/0193121 A1 | 8/2006 | Kamoshita |
| 2006/0193130 A1 | 8/2006 | Ishibashi |
| 2006/0198147 A1 | 9/2006 | Ge |
| 2006/0208260 A1 | 9/2006 | Sakuma et al. |
| 2006/0226772 A1 | 10/2006 | Tan et al. |
| 2006/0227537 A1 | 10/2006 | Vanderschuit |
| 2006/0243997 A1 | 11/2006 | Yang et al. |
| 2006/0250802 A1 | 11/2006 | Herold |
| 2006/0255353 A1 | 11/2006 | Taskar et al. |
| 2006/0261359 A1 | 11/2006 | Huang |
| 2006/0273340 A1 | 12/2006 | Lv |
| 2006/0274524 A1 | 12/2006 | Chang et al. |
| 2006/0289884 A1 | 12/2006 | Soules et al. |
| 2007/0018181 A1 | 1/2007 | Steen et al. |
| 2007/0031685 A1 | 2/2007 | Ko et al. |
| 2007/0086189 A1 | 4/2007 | Raos et al. |
| 2007/0090391 A1 | 4/2007 | Diamantidis |
| 2007/0090737 A1 | 4/2007 | Hu et al. |
| 2007/0120879 A1 | 5/2007 | Kanade et al. |
| 2007/0125982 A1 | 6/2007 | Tian et al. |
| 2007/0139949 A1 | 6/2007 | Tanda et al. |
| 2007/0291490 A1 | 12/2007 | Tajul et al. |
| 2008/0013316 A1 | 1/2008 | Chiang |
| 2008/0048200 A1 | 2/2008 | Mueller et al. |
| 2008/0061687 A1 | 3/2008 | Cok et al. |
| 2008/0070331 A1 | 3/2008 | Ke |
| 2008/0074032 A1 | 3/2008 | Yano et al. |
| 2008/0185600 A1 | 8/2008 | Thomas |
| 2009/0001372 A1 | 1/2009 | Arik et al. |
| 2009/0256167 A1 | 10/2009 | Peeters et al. |
| 2009/0324875 A1 | 12/2009 | Heikkila |
| 2010/0177534 A1 | 7/2010 | Ryu et al. |

FOREIGN PATENT DOCUMENTS

| | | |
|---|---|---|
| JP | 63086484 A | 4/1988 |
| JP | 7-99372 A | 4/1995 |
| JP | 10-127789 A | 5/1998 |
| JP | 2000-293123 A | 10/2000 |
| JP | 2001-36148 A | 2/2001 |
| JP | 3351103 B2 | 11/2002 |
| JP | 2004-520613 A | 7/2004 |
| JP | 2004-341446 A | 12/2004 |
| JP | 2006-32963 A | 2/2006 |
| JP | 2009-540558 A | 11/2009 |
| KR | 10-0693463 B1 | 3/2007 |
| WO | 2002/056111 A1 | 7/2002 |
| WO | 02/061805 A2 | 8/2002 |
| WO | 2004/100213 A2 | 11/2004 |
| WO | 2005/060309 A2 | 6/2005 |
| WO | 2005/104247 A1 | 11/2005 |
| WO | 2007/069119 A1 | 6/2007 |
| WO | 2007/130357 A2 | 11/2007 |
| WO | 2007/130359 A2 | 11/2007 |
| WO | 2008/007232 A2 | 1/2008 |
| WO | 2009/054948 A1 | 4/2009 |

OTHER PUBLICATIONS

Office Action received for Chinese Patent Application No. 200880120370.1, mailed on Mar. 27, 2012, 3 pages. See Statement Under 37 CFR § 1.98(a) (3).

Office Action received for Chinese Patent Application No. 200880120370.1, mailed on Jul. 18, 2013, 7 pages. See Statement Under 37 CFR § 1.98(a) (3).

Office Action received for Japanese Patent Application No. 2010-531020, mailed on May 14, 2013, 4 pages (2 pages of English Translation and 2 pages of Official copy).

Office Action received for Korean Patent Application No. 10-2010-7011289, mailed on Jun. 27, 2014, 7 pages (3 pages of English Translation and 4 pages of KROA).

Office Action Received for Japanese Patent Application No. 2010-531020, mailed on Jul. 29, 2014, 9 pages (2 pages of English Translation and 7 pages of Official Copy).

Office Action received for Chinese Patent Application No. 200880120370.1, mailed on Jan. 30, 2014. (See Communication under 37 CFR § 1.98(a) (3)).

Non Final Office Action received for U.S. Appl. No. 12/299,088, mailed on Jun. 21, 2010, 11 pages.

Office Action received for Chinese Patent Application No. 200780015112.2, mailed on Apr. 8, 2010, 25 pages (9 pages of Office Action and 16 pages of English Translation).

Office Action received for Chinese Patent Application No. 200780015303.9, mailed on Jun. 8, 2010, 8 pages of English Translation.

Office Action received for NZ Patent Application No. 573336, mailed on Apr. 19, 2010, 2 pages.

International Preliminary Report on Patentability received for PCT Patent Application No. PCT/US2007/010467, issued on Nov. 27, 2008, 6 pages.

International Search Report received for PCT Patent Application No. PCT/US2007/010467, mailed on Aug. 27, 2008, 1 page.

International Preliminary Report on Patentability received for PCT Patent Application No. PCT/US2007/010469, issued on Nov. 4, 2008, 12 pages.

International Search Report received for PCT Patent Application No. PCT/US2007/010469, mailed on Aug. 7, 2008, 2 pages.

International Preliminary Report on Patentability received for PCT Patent Application No. PCT/US2008/010713, mailed on Mar. 25, 2010, 6 pages.

International Search Report received for PCT Patent Application No. PCT/US2008/010713, mailed on Nov. 21, 2008, 1 page.

International Search Report received for PCT Patent Application No. PCT/US2009/004662, mailed on Oct. 5, 2009, 2 pages.

(56) References Cited

OTHER PUBLICATIONS

International Search Report received for PCT Patent Application No. PCT/US2009/005030, mailed on Nov. 12, 2009, 2 pages.
Ryu et al., "Liquid Crystalline Assembly of Rod-Coil Molecules", Structure & Bonding, vol. 128, 2008, pp. 63-98.
Non Final Office Action received for U.S. Appl. No. 12/299,049, mailed on Mar. 16, 2012, 11 pages.
Notice of Allowance received for U.S. Appl. No. 12/299,088, mailed on Apr. 3, 2012, 10 pages.
Non Final Office Action received for U.S. Appl. No. 13/059,394 on Jun. 28, 2012, 10 pages.
Non Final Office Action received for U.S. Appl. No. 13/476,986, mailed on Aug. 30, 2012, 10 pages.
Final Office Action received for U.S. Appl. No. 12/299,049, mailed on Sep. 5, 2012, 15 pages.
Extended European Search Report received for European Patent Application No. 08842545.9, mailed on Jul. 26, 2012, 7 pages.
Non Final Office Action received for U.S. Appl. No. 12/299,049, mailed on Jun. 16, 2011, 32 pages.
Final Office Action received for U.S. Appl. No. 12/299,049, mailed on Jan. 4, 2012, 20 pages.
Final Office Action received for U.S. Appl. No. 12/678,287, mailed on Oct. 11, 2011, 7 pages.
Non Final Office Action received for U. S. Appl. No. 12/678,287, mailed on Apr. 19, 2011, 5 pages.
International Preliminary Report on Patentability received for PCT Patent Application No. PCT/US2009/004662, mailed on Mar. 3, 2011, 9 pages.
International Preliminary Report on Patentability received for PCT Patent Application No. PCT/US2009/005030, mailed on Mar. 24, 2011, 9 pages.
Final Office Action received for U.S. Appl. No. 12/299,088, mailed on May 13, 2011, 18 pages.
International Preliminary Report on Patentability received for PCT Patent Application No. PCT/US2008/011984, mailed on May 6, 2010, 5 pages.
International Search Report received for PCT Patent Application No. PCT/US2008/011984, mailed on Jan. 15, 2009, 1 page.
Office Action received for Japanese Patent Application No. 2010-531020, mailed on Dec. 18, 2012, 8 pages (4 pages of English Translation and 4 pages of Office Action).
Non Final Office Action received for U.S. Appl. No. 12/739,944, mailed on May 16, 2012, 8 pages.
Notice of Allowance received for U.S. Appl. No. 12/739,944, mailed on Nov. 26, 2012, 7 pages.
Office Action Received for Canadian Patent Application No. 2,706,975, mailed on Sep. 25, 2014, 2 pages.

\* cited by examiner

DIFFUSER FOR LED LIGHT SOURCES

FIELD OF THE INVENTION

The present invention relates to providing uniformly dispersed light from a light emitting diode (LED) source and to the efficient removal of the heat generated by the LEDs, and more particularly, to the uniform dispersion of the light generated by LEDs in a light source without substantial light loss, in order to provide a uniform illumination surface, and to permit the LEDs to be run at higher power.

BACKGROUND OF THE INVENTION

An LED consists of a semiconductor junction, which emits light due to a current flowing through the junction. A white LED is typically made by using a blue or ultraviolet LED die, and adding a plastic coat to it, the coat containing a phosphor. The phosphor is used to convert the blue or ultraviolet light emitted by the LED die to a spectrum of light that more or less closely resembles white light or blackbody radiation.

At first sight, it would seem that white LEDs should make an excellent replacement for the traditional lighting sources. At equal power, they give far more light output than do incandescent bulbs, or, what is the same thing, they use much less power for equal light; and their operational life is orders of magnitude larger, namely, 10-100 thousand hours vs. 1-2 thousand hours. Similarly, their ultimate efficiency is higher than that of fluorescent tubes, and their lifetime is also substantially longer than that of fluorescent tubes.

However, LEDs have a number of drawbacks that have prevented them, so far, from being widely adopted as traditional lighting sources. One of these is that LEDs are discrete sources of light. They produce intense light within the beam of their output, but dim light outside of that beam. Using multiple LEDs does not fully alleviate this problem, as there are then interference patterns in the light.

In the past, LEDs have had diffusers added to their shells or bodies to spread out the light from the LED as a solution to the point light source problem. Another method has been to roughen the surface of the LED package. Neither of these methods accomplishes uniform light distribution for an LED light source, and may lower luminous efficiency. Methods of accomplishing approximate angular uniformity may also involve partially absorptive processes, further lowering luminous efficacy.

Another drawback with LEDs is that although LEDs require substantially less power for a given light output than do incandescent bulbs, it still takes many watts to generate adequate light for illumination. An LED, being a semiconductor, is nearly a point source of heat, and cannot be allowed to get hotter than a range of approximately 85-150° C. The LED thus has a substantial heat problem.

One possible solution to this heat problem is to use a large metallic heat sink, attached to the LEDs. This heat sink would then extend out away from the bulb, removing the heat from the LEDs. However, this solution is undesirable, because the heat sink may make it difficult for the light source to fit in to the desired form factor.

SUMMARY OF THE INVENTION

This invention has the object of developing a diffuser for LEDs, such that the above-described primary problems are effectively solved. It aims at providing a diffuser that may be attached to an LED light source, the diffuser uniformly distributing the light over the surface of the light source with very little light loss, and also providing a large surface area for heat dissipation. The apparatus includes a sealed panel, preferentially formed of a plastic such as polycarbonate, and a filler material, preferentially formed of a fluid, plastic or gel. The fluid, gel or plastic is designed to either contain, or itself form, a system of Mie scatterers. Additionally, the fluid, gel or plastic is designed to be, or to contain, material that efficiently removes heat from the LEDs and conveys it to a suitable surface for removal.

In accordance with one embodiment, the sealed panel has a rectangular cross-section. The fluid, gel or plastic fills the panel to approximately 70-99%, or as suitable to provide room for thermal expansion. The panel may be built as an integral part of the LED light source assembly, or may be an add-on attached by any of several well-known methods.

In accordance with another embodiment, the fluid, gel or plastic may be distributed in the sealed panel with a non-uniform spatial distribution. This may be used to generate light that is more intense in one direction than another.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
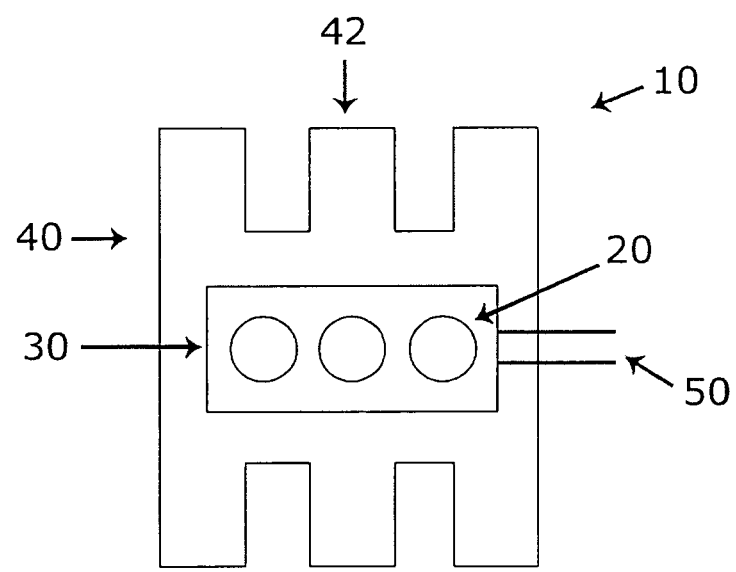
FIG. 1 is a view of a present state-of-the-art LED light source showing the reason for its directionality of light output.

Reference will now be made in detail to the present preferred embodiments of the invention, examples of which are illustrated in the accompanying drawings. Wherever possible, the same reference numbers are used in the drawings and the description to refer to the same or like parts.

According to the design characteristics, a detailed description of the current practice and preferred embodiments is given below.

FIG. 1 is a view of a present state-of-the-art LED light source 10 showing the reason for its directionality of light output and the construction used for removing heat. As shown in FIG. 1, the LEDs 20 are mounted on a circuit board 30. Since said LEDs are point sources of light, the light emitted from the said LED light source appears concentrated in beams. Said circuit board provides electrical interconnects for the LEDs 20, and may also provide electrical isolation. Wires 50 come from the circuit board to power the LEDs from a power source (not shown). The circuit board 30 is mounted to a heatsink 40, made of a low thermal-resistivity material, whose purpose is to provide a low thermal-resistance path to the ambient for heat generated by the LEDs 20. In the drawing, heatsink 40 has fins 42 protruding from it, but any shape of heatsink may be used.

Figure 2:
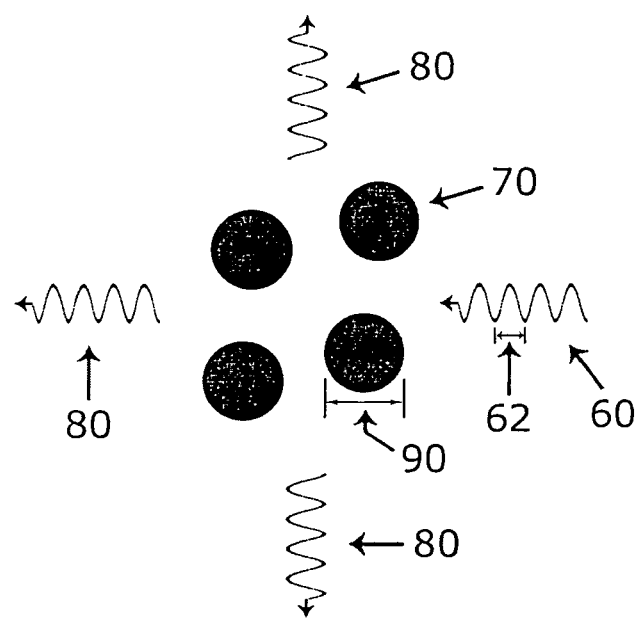
FIG. 2 is a cross-sectional view of light emitted from an LED having Mie scattering from supra-wavelength particles.

FIG. 2 shows a cross-sectional view of light emitted from an LED having Mie scattering from a plurality of supra-wavelength particles 70 and an equal scattering of each of the wavelengths 80 according to a further embodiment. Typically, the incoming light 60 will include a plurality of wavelength components, including a wavelength 62 based on the light-emitting material used within the LED. For example, in a typical LED emission spectrum, the wavelength 62 emitted from the LED corresponding to the color blue will be approximately 410 to 450 nm. As shown in FIG. 2, the incoming light 60 impinges on a dispersed set or plurality of particles 70 having an effective diameter 90, wherein the effective diameter 90 is greater than a dominant wavelength 62 of light emitted from the LED. The effective diameter 90 of the dispersed particles 70 are preferably a size one to a few times larger than a dominant wavelength 62 of the light emitting source. For example, for an LED producing a blue light, the dispersed set of particles 70 can be alumina trihydrate having a mean diameter of approximately 1.1 microns. It can be appreciated that any suitable particles having an effective diameter 90, which is greater than the dominant wavelength 62 of the emitting light source or LED and creates Mie scattering can be used. It can be appreciated that the particles need not be spherical, or even approximately spherical, and that other shapes can be used such as disk or rod-shaped particles. This creates the condition for Mie scattering of the incoming light 60, wherein each of the incoming wavelengths 62 are scattered into an outgoing wavelength 80. The transmitted light or outgoing wavelengths 80 are thus dispersed in directions relative to the incoming light 60, without significantly affecting the light intensity.

Figure 3:
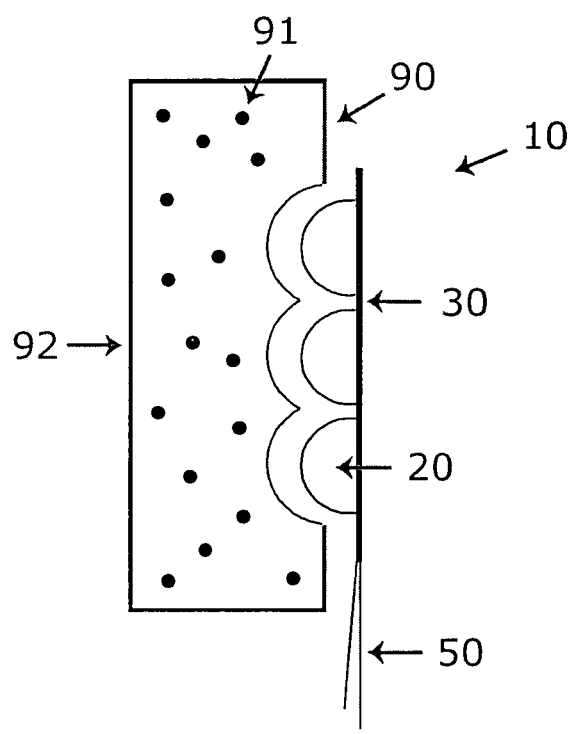
FIG. 3 is a cross-sectional view of an LED light source showing the diffuser mounted in front of the LEDs.

FIG. 3 is a cross-sectional view of an LED light source 10 showing the diffuser 90 mounted in front of the LEDs. As shown in FIG. 3, the LEDs 20 are mounted on a circuit board 30, and have power wires 50 coming off to their power source, not shown. Placed in front of said LEDs is the diffuser panel 90. Said diffuser panel is shown as being form-fitted to the LEDs 20 and circuit board 30, providing a low-thermal resistance path for the heat both of said LEDs and for the heat of said LEDs being transferred to said circuit board. The heat conducted by the diffuser panel 90 may be transferred to ambient by conduction and radiation from the emitting surface 92. The diffuser panel 90 also spreads out the light from the LEDs 20, producing an approximately uniform light output on the emitting surface 92. It can be appreciated that the diffuser panel 90 need not be rectangular in cross-section, and that other shapes such as disk can be used. It can also be appreciated that the diffuser panel 90 need not have a flat emitting surface, and that other shapes such as hemispherical can be used. It can also be appreciated that the diffuser panel 90 need not be form-fitted to the LEDs 20, but may simply be placed in front of them.

As shown in FIG. 3, the LED light source 10 includes at least one LED, a panel 90 between the at least one LED 20 and a light emission surface of the light source, and a filler material 91 inside the panel 90 to scatter the light from the at least one LED 20. In accordance with one embodiment, the filler material 91 is a poly(acrylamide) hydrogel having a plurality of particles, which have been lightly coated with inorganic particles, such as calcium carbonate.

In accordance with another embodiment, the LED light source 10 includes at least one LED 20, a panel between the at least one LED 20 and a light emission surface of the light source 10, and a filler material 91 inside the panel 90 to scatter the light from the at least one LED 20, wherein the filler material 91 contains small Mie cells plus a second different density component. In accordance with an embodiment, the filler material 91 is comprised of a hydrocarbon-based oil, with said second different density component being composed of water and a small amount of a surfactant. It can be appreciated that the filler material 91 is composed of components that are individually each transparent to light.

Figure 4:
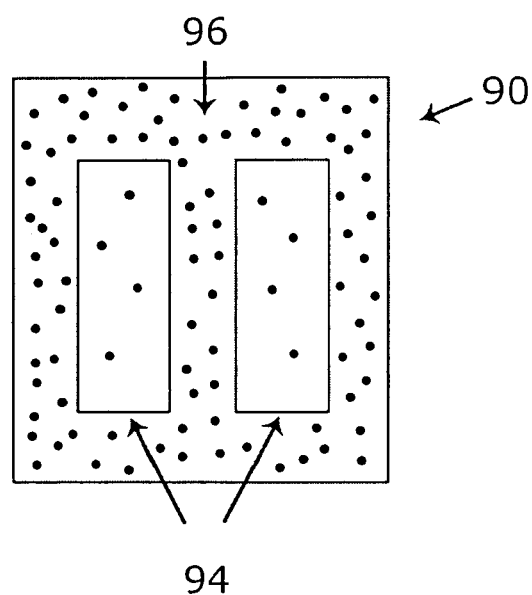
FIG. 4 is a cross-sectional view of an LED light source showing a diffuser with non-uniform spatial distribution.

FIG. 4 is a cross-sectional view of an LED light source, not shown, showing a diffuser 90 with non-uniform spatial distribution. As shown in FIG. 4, the diffuser 90 has two rectangular areas 94 in which the density of the fluid, gel or plastic filler material is lower than in the other areas 96 of said diffuser 90. The lower density filler material areas 94 may be formed with discrete boxes formed within the diffuser 90, or may simply be modulation in the density of the material used. The effect of the lower density filler material areas 94 is to produce light from those areas that is more direct and intense than in the other areas 96 of the diffuser 90. The other areas 96 produce a more diffuse and less intense light. It can be appreciated that the lower density filler material areas 94 need not be rectangular, and may be of other shapes such as circles and annuli. It can also be appreciated that the filler material may be of uniform density, and only the Mie scatterers may be varied in density.

It will be apparent to those skilled in the art that various modifications and variation can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED light source comprising:
at least one LED configured to emit a light, wherein the light has a dominant wavelength;
a diffuser; and
wherein the diffuser comprises a sealed panel having a first side configured to receive the light emitted by the at least one LED and a second side configured to emit light,
wherein a filler material is disposed between the first side and the second side of the sealed panel,
wherein the filler material is a fluid or gel,
wherein the filler material comprises particles,
wherein the mean diameter of the particles is at least as large as the dominant wavelength, and
wherein the particles are configured to scatter the light emitted by the at least one LED.

2. The LED light source of claim 1, wherein:
the diffuser comprises a first area with a first density of the filler material and a second area with a second density of the filler material; and
the first density is not the same as the second density.

3. The LED light source of claim 1, wherein:
the diffuser comprises a first area with a first density of the particles and a second area with a second density of the particles; and
the first density is not the same as the second density.

4. The LED light source of claim 1, wherein the particles comprise alumina trihydrate.

5. The LED light source of claim 1, wherein the at least one LED is a blue or ultraviolet LED without a phosphor, and the filler material contains at least one phosphor.

6. The LED light source of claim 1, wherein the filler material is a hydrogel.

7. The LED light source of claim 1, wherein the particles have been coated with inorganic particles.

8. An LED light source comprising:
at least one LED configured to emit a light, wherein the light has a dominant wavelength;
a diffuser; and
wherein the diffuser comprises a poly(acrylamide) hydrogel including particles, and a sealed panel having a first side configured to receive the light emitted by the at least one LED and a second side configured to emit light, wherein a filler material is disposed between the first side and the second side of the sealed panel, wherein the filler material is a poly(acrylamide) hydrogel, wherein the filler material comprises particles, wherein the mean diameter of the particles is at least as large as the dominant wavelength, and wherein the particles are configured to scatter the light emitted by the at least one LED.

9. The LED light source of claim 8, wherein:

the diffuser comprises a first area with a first density of the particles and a second area with a second density of the particles; and the first density is not the same as the second density.

10. The LED light source of claim 8, wherein the particles comprise alumina trihydrate.

11. The LED light source of claim 8, wherein the at least one LED is a blue or ultraviolet LED without a phosphor, and the poly(acrylamide) hydrogel contains at least one phosphor.

12. The LED light source of claim 8, wherein the particles have been coated with inorganic particles.

13. An LED light source comprising:

at least one LED configured to emit a light, wherein the light has a dominant wavelength;

a diffuser; and wherein the diffuser comprises a sealed panel having a first side configured to receive the light emitted by the at least one LED and a second side configured to emit light, wherein a filler material is disposed between the first side and the second side of the sealed panel, wherein the filler material is a hydrocarbon-based oil, wherein the filler material comprises particles, wherein the mean diameter of the particles is at least as large as the dominant wavelength, and wherein the particles are configured to scatter the light emitted by the at least one LED.

14. The LED light source of claim 13, wherein the diffuser further comprises a surfactant.

15. The LED light source of claim 13, wherein:

the diffuser comprises a first area with a first density of the hydrocarbon-based oil and a second area with a second density of the hydrocarbon-based oil; and the first density is not the same as the second density.

16. The LED light source of claim 13, wherein:

the diffuser comprises a first area with a first density of the particles and a second area with a second density of the particles; and the first density is not the same as the second density.

\* \* \* \* \*